United States Patent
Kim et al.

(10) Patent No.: US 10,446,793 B2
(45) Date of Patent: Oct. 15, 2019

(54) DISPLAY APPARATUS

(71) Applicant: Samsung Display Co., Ltd., Yongin-si, Gyeonggi-do (KR)

(72) Inventors: Taehyun Kim, Yongin-si (KR); Seungmin Lee, Yongin-si (KR); Donghwan Shim, Yongin-si (KR); Jungkyu Lee, Yongin-si (KR); Seunghwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/617,427

(22) Filed: Jun. 8, 2017

(65) Prior Publication Data

US 2018/0102502 A1    Apr. 12, 2018

(30) Foreign Application Priority Data

Oct. 10, 2016   (KR) .................. 10-2016-0130829

(51) Int. Cl.
*H01L 51/50* (2006.01)
*H01L 51/52* (2006.01)
(Continued)

(52) U.S. Cl.
CPC .......... *H01L 51/5256* (2013.01); *H01L 22/12* (2013.01); *H01L 27/3225* (2013.01);
(Continued)

(58) Field of Classification Search
CPC ....... H01L 27/32–3293; H01L 27/3276; H01L 27/3246; H01L 27/3225; H01L 27/3262;
(Continued)

(56) References Cited

U.S. PATENT DOCUMENTS

| 8,410,518 B2 | 4/2013 | Chung |
| 2003/0094615 A1* | 5/2003 | Yamazaki ............... H01L 27/12 257/72 |

(Continued)

FOREIGN PATENT DOCUMENTS

| CN | 105895827 A | 8/2016 |
| JP | 2015-56335 A | 3/2015 |

(Continued)

OTHER PUBLICATIONS

EPO Extended Search Report dated Mar. 9, 2018, for corresponding European Patent Application No. 17189425.6 (7 pages).

*Primary Examiner* — Natalia A Gondarenko
(74) *Attorney, Agent, or Firm* — Lewis Roca Rothgerber Christie LLP

(57) ABSTRACT

A display apparatus includes a substrate having a display area in which an image is displayed and a peripheral area outside the display area; a thin film encapsulation layer at the display area, the thin film encapsulation layer including a first inorganic encapsulation layer, an organic encapsulation layer, and a second inorganic encapsulation layer that are stacked; a dam at the peripheral area; and an organic material detection part outside the dam, the organic material detection part including at least one detector. The first inorganic encapsulation layer and the second inorganic encapsulation layer extend from the display area to the peripheral area, and the first inorganic encapsulation layer has an opening that corresponds to at least a portion of the organic material detection part.

20 Claims, 13 Drawing Sheets

(51) Int. Cl.
*H01L 51/56* (2006.01)
*H01L 27/32* (2006.01)
*H01L 21/66* (2006.01)
*H01L 51/00* (2006.01)
*H01L 27/12* (2006.01)

(52) U.S. Cl.
CPC ...... *H01L 27/3246* (2013.01); *H01L 27/3258* (2013.01); *H01L 27/3262* (2013.01); *H01L 27/3265* (2013.01); *H01L 27/3276* (2013.01); *H01L 51/0031* (2013.01); *H01L 51/5253* (2013.01); *H01L 51/56* (2013.01); *H01L 27/124* (2013.01); *H01L 27/1248* (2013.01); *H01L 27/1255* (2013.01); *H01L 2227/323* (2013.01)

(58) Field of Classification Search
CPC ............. H01L 27/3265; H01L 27/3258; H01L 27/1248; H01L 27/124; H01L 27/1255; H01L 2227/32; H01L 51/5256; H01L 51/56; H01L 22/12; H01L 51/5012; H01L 51/5092; H01L 51/0097; H01L 51/5088; H01L 2227/323; G06F 3/0416; G06F 3/044; G06F 3/0412
USPC .................................. 257/71, 91; 438/34, 40
See application file for complete search history.

(56) References Cited

U.S. PATENT DOCUMENTS

| | | | |
|---|---|---|---|
| 2006/0202615 A1* | 9/2006 | Murakami | H01L 51/5237 313/506 |
| 2015/0041772 A1* | 2/2015 | Han | H01L 27/3248 257/40 |
| 2015/0060806 A1* | 3/2015 | Park | H01L 51/5253 257/40 |
| 2015/0091030 A1* | 4/2015 | Lee | H01L 27/3246 257/91 |
| 2015/0213763 A1* | 7/2015 | Ota | G09G 3/3266 345/211 |
| 2015/0228927 A1 | 8/2015 | Kim | |
| 2016/0285038 A1 | 9/2016 | Kim | |
| 2016/0285045 A1 | 9/2016 | Park et al. | |
| 2016/0351640 A1 | 12/2016 | Lee et al. | |
| 2017/0207276 A1* | 7/2017 | Miyamoto | H01L 51/5246 |
| 2018/0226607 A1 | 8/2018 | Li et al. | |

FOREIGN PATENT DOCUMENTS

| | | |
|---|---|---|
| KR | 10-2004-0047260 A | 6/2004 |
| KR | 10-2012-0030290 A | 3/2012 |
| KR | 10-2012-0137016 A | 12/2012 |
| KR | 10-2015-0025994 A | 3/2015 |
| KR | 10-2015-0037134 A | 4/2015 |
| KR | 10-2015-0040406 A | 4/2015 |
| KR | 10-2015-0094950 A | 8/2015 |
| KR | 10-2016-0000853 A | 1/2016 |

* cited by examiner

DISPLAY APPARATUS

CROSS-REFERENCE TO RELATED APPLICATION

This application claims priority to and the benefit of Korean Patent Application No. 10-2016-0130829, filed on Oct. 10, 2016, in the Korean Intellectual Property Office, the disclosure of which is incorporated herein in its entirety by reference.

BACKGROUND

1. Field

One or more embodiments relate to a display apparatus.

2. Description of the Related Art

Display apparatuses display an image. Examples of the display apparatuses include liquid crystal displays (LCDs), electrophoretic displays, organic light-emitting displays, inorganic light-emitting displays, field emission displays, surface-conduction electron-emitter displays, plasma displays, and cathode ray displays.

Such display apparatuses include a display area that displays an image, and a peripheral area on which wiring and the like for transmitting signals to the display area are arranged. In recent years, a technique of encapsulating a display area and a peripheral area by using an organic layer in order to maintain high quality of display apparatuses and also achieve thin and light display apparatuses has been actively studied.

SUMMARY

One or more embodiments include a display apparatus having a suitable (e.g., an optimal) thin film encapsulation layer capable of preventing or reducing permeation of external moisture or oxygen.

Additional aspects will be set forth in part in the description which follows and, in part, will be apparent from the description, or may be learned by practice of the presented embodiments.

According to one or more embodiments, a display apparatus includes a substrate having a display area in which an image is displayed and a peripheral area outside the display area; a thin film encapsulation layer at the display area, the thin film encapsulation layer including a first inorganic encapsulation layer, an organic encapsulation layer, and a second inorganic encapsulation layer that are stacked; a dam at the peripheral area; and an organic material detection part outside the dam, the organic material detection part including at least one detector. The first inorganic encapsulation layer and the second inorganic encapsulation layer extend from the display area to the peripheral area, and the first inorganic encapsulation layer has an opening that corresponds to at least a portion of the organic material detection part.

The second inorganic encapsulation layer may fill the opening or may be at the opening.

A height of the at least one detector from an upper surface of the substrate may be less than a height of the dam from the upper surface of the substrate.

The organic material detection part may include a plurality of detectors, and the opening may correspond to one of the plurality of detectors.

The display apparatus may further include a thin film transistor (TFT) at the display area, the TFT including a semiconductor layer, a gate electrode, a source electrode, and a drain electrode, and the at least one detector may be on a same layer as the gate electrode, and may include a same material as the gate electrode.

The display apparatus may further include a first thin film transistor (TFT) at the display area, the first TFT including a first semiconductor layer, a first gate electrode, a first source electrode, and a first drain electrode, and a second TFT at the display area, the second TFT including a second semiconductor layer, a second gate electrode, a second source electrode, and a second drain electrode. The first gate electrode and the second gate electrode may be on different layers. The at least one detector may include a first layer on a same layer as the first gate electrode and may include a same material as the first gate electrode, and a second layer on a same layer as the second gate electrode and including a same material as the second gate electrode.

An insulating layer may be between the first layer and the second layer.

The display apparatus may further include a thin film transistor (TFT) at the display area, the TFT including a semiconductor layer, a gate electrode, a source electrode, and a drain electrode, and a storage capacitor that overlaps with the TFT. The storage capacitor may include a first electrode, a dielectric layer, and a second electrode that are on a same layer as the gate electrode and are sequentially stacked. The at least one detector may be on a same layer as the second electrode and may include a same material as the second electrode.

The display apparatus may further include a thin film transistor (TFT) at the display area, the TFT including a semiconductor layer, a gate electrode, a source electrode, and a drain electrode. The at least one detector may be on a same layer as the source electrode or the drain electrode and may include a same material as the source electrode or the drain electrode.

The display apparatus may further include wiring at the peripheral area. The dam may cover at least a portion of the wiring.

The dam may include a first dam and a second dam spaced from the first dam, and at least one of the first dam and the second dam may include a plurality of layers.

As seen in a plan view of the display apparatus, at least a portion of the at least one detector may be along an edge of the display area, and the at least one detector may have a groove pattern near the display area.

The at least one detector may have a straight line shape extending in a first direction, and a groove pattern may be at a certain angle to the first direction.

The at least one detector may be curved.

The organic material detection part may include a first detector and a second detector. The first detector and the second detector may be spaced apart from each other and may be along an edge of the display area. The first detector may have a groove pattern near the display area, and the second detector may have no groove patterns.

The opening may correspond to a first detector.

According to one or more embodiments, an organic material detecting method is performed at a display apparatus having a display area in which an image is displayed and a peripheral area outside the display area and including a thin film encapsulation layer at the display area, the thin film encapsulation layer including a stack of a first inorganic encapsulation layer, an organic encapsulation layer, and a second inorganic encapsulation layer. The organic material detecting method includes forming the organic encapsulation layer; and detecting an organic material that may overflow while the organic encapsulation layer is being formed, wherein the detecting is performed by an organic material detection part at the peripheral area. The first inorganic encapsulation layer and the second inorganic encapsulation layer extend from the display area to the peripheral area, and the first inorganic encapsulation layer has an opening that corresponds to at least a portion of the organic material detection part.

The organic material detection part may include at least one detector, and the detecting of the organic material may include checking the degree of overflow of the organic material by measuring a step difference of the at least one detector.

The organic material detection part may include at least one detector. As seen in a plan view of the display apparatus, at least a portion of the at least one detector may be along an edge of the display area, and the at least one detector may have a groove pattern near the display area. The detecting of the organic material may include checking an area to which the organic material is overflowed, by visually recognizing a planar shape of the organic material detection part.

The display apparatus may further include a dam in the peripheral area, and the dam may be between the display area and the organic material detection part.

BRIEF DESCRIPTION OF THE DRAWINGS

These and/or other aspects will become apparent and more readily appreciated from the following description of some of the embodiments, taken in conjunction with the accompanying drawings in which.

DETAILED DESCRIPTION

Figure 1:
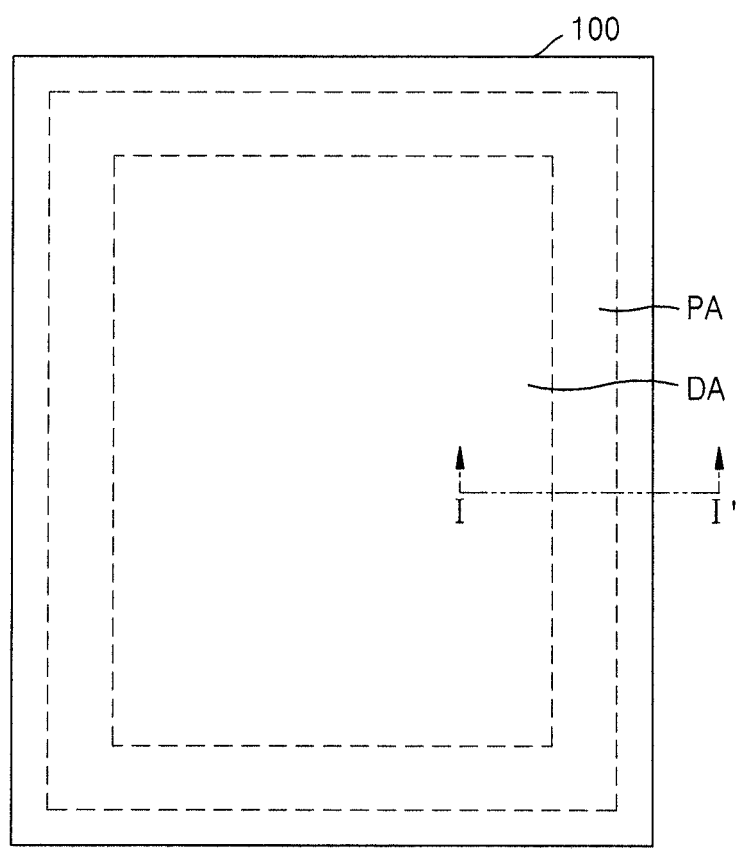
FIG. 1 is a plan view of a display apparatus according to an embodiment.

As the invention allows for various suitable changes and numerous embodiments, particular embodiments will be illustrated in the drawings and described in detail in the written description. Hereinafter, effects and features of the present invention and a method for accomplishing them will be described more fully with reference to the accompanying drawings, in which embodiments of the invention are shown. This invention may, however, be embodied in many different forms and should not be construed as being limited to the embodiments set forth herein.

One or more embodiments of the invention will be described below in more detail with reference to the accompanying drawings. Those components that are the same or are in correspondence are rendered the same reference numeral regardless of the figure number, and redundant explanations may be omitted.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

In the drawings, the thicknesses of layers and regions may be exaggerated or minimized for convenience of explanation. In other words, since sizes and thicknesses of components in the drawings are arbitrarily illustrated for convenience of explanation, the present invention is not limited thereto.

Display apparatuses display an image. Examples of the display apparatuses may include liquid crystal displays (LCDs), electrophoretic displays, organic light-emitting displays, inorganic light-emitting displays, field emission displays, surface-conduction electron-emitter displays, plasma displays, and cathode ray displays.

Although an organic light-emitting display device will now be illustrated and described as a display apparatus according to an embodiment of the present invention, the present invention is not limited thereto, and various types of display apparatuses may be used.

FIG. 1 is a plan view of a portion of a display apparatus according to an embodiment. Referring to FIG. 1, the display apparatus according to the present embodiment includes a substrate 100. The substrate 100 includes a display area DA and a peripheral area PA around the display area DA.

In the display area DA of the substrate 100, a plurality of pixels may be arranged to display an image. In the display area DA, display devices (e.g., organic light-emitting devices (OLEDs)), thin film transistors (TFTs), and capacitors may be arranged, and pixels for displaying an image through electrical combinations of the display devices, the TFTs, and the capacitors. A driving current that passes through a display device may be generated according to a gate signal, a data signal, a driving voltage ELVDD, and a common voltage ELVSS, which are supplied to a pixel, and the display device may emit light with a brightness corresponding to the driving current.

The peripheral area PA is arranged outside the display area DA. In the peripheral area PA, lines that supply various signals and/or power to the display area DA may be arranged, and a TFT (not shown) for controlling an electrical signal that is applied to the display area DA may be further arranged in addition to the lines. In the peripheral area PA, a dam, a trench, and/or the like for stopping flow of an organic layer that is used when the display apparatus is manufactured may also be arranged.

Figure 2A:
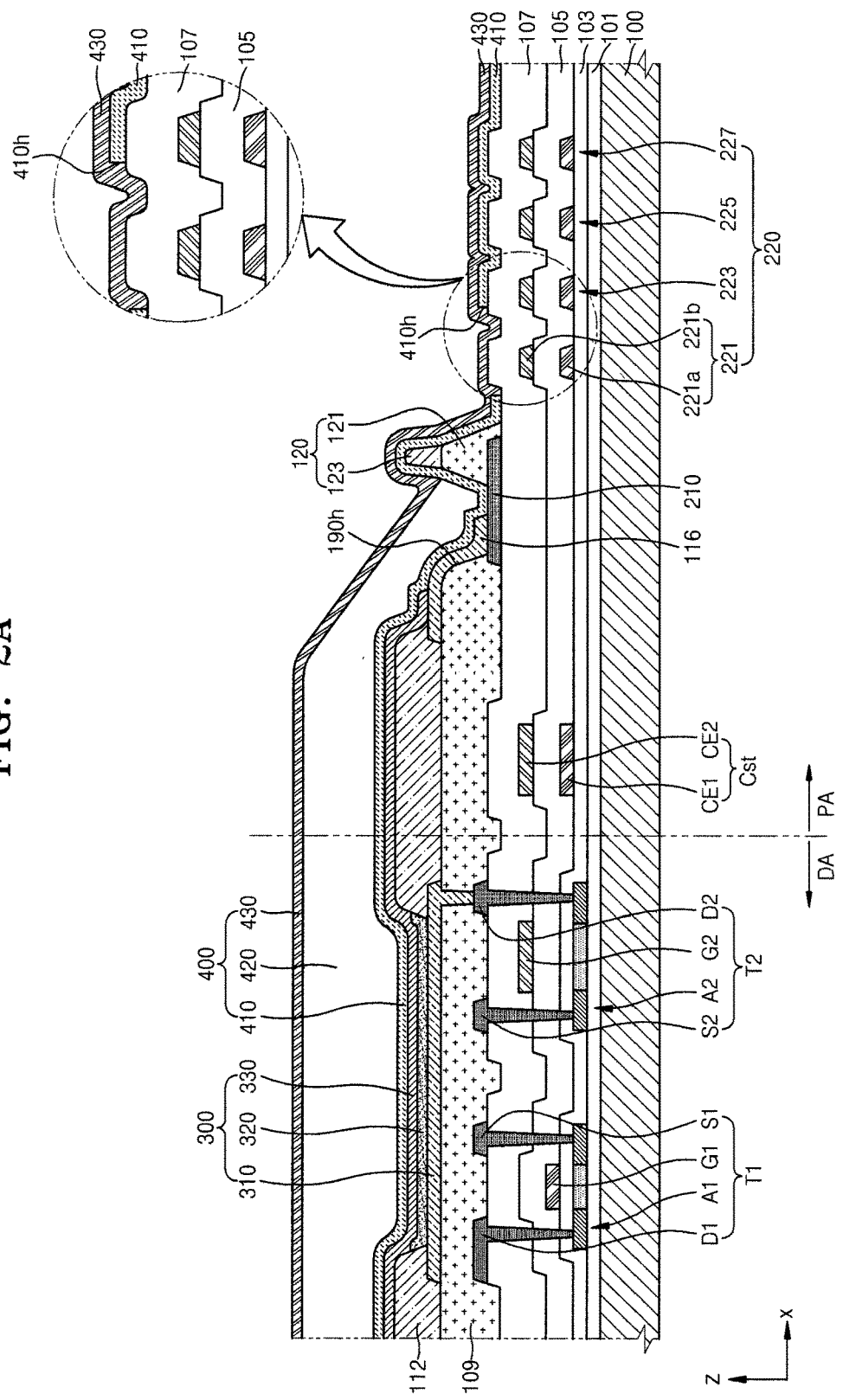
FIG. 2A is a cross-sectional view taken along line I-I' of FIG. 1.

FIG. 2A is a cross-sectional view of the display apparatus of FIG. 1 taken along line I-I' of FIG. 1. Referring to FIG. 2A, the display apparatus according to an embodiment includes the substrate 100 including the display area DA and the peripheral area PA, and a thin film encapsulation layer 400 that encapsulates the display area DA and the peripheral area PA.

The substrate 100 may include various suitable materials. For example, the substrate 100 may be formed of a transparent glass material containing silicon oxide (e.g., $SiO_2$) as a main component. However, the material used to form the substrate 100 is not limited thereto, and the substrate 100 may be formed of a transparent plastic material. The plastic material may be an organic material selected from polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP), which are insulative materials.

The buffer layer 101 may be positioned on the substrate 100 and may reduce or prevent infiltration of a foreign material, moisture, or ambient air from below the substrate 100 and may provide a flat surface on the substrate 100. The buffer layer 101 may include an inorganic material (such as oxide or nitride), an organic material, or an organic and inorganic complex, and may be formed as a single layer or multiple layers of an inorganic material and an organic material.

A first TFT T1 includes a semiconductor layer A1, a first gate electrode G1, a source electrode S1, and a drain electrode D1, and a second TFT T2 includes a semiconductor layer A2, a second gate electrode G2, a source electrode S2, and a drain electrode D2.

A case in which the first and second TFTs T1 and T2 are of a top gate type will now be illustrated and described. However, the present embodiment is not limited thereto, and various suitable types of TFTs, such as a bottom gate type TFT, may be used.

Although the two TFTs T1 and T2 are illustrated hereinafter, the present invention is not limited thereto. In embodiments of the present invention, a display apparatus may employ at least two TFTs T1 and T2 for a single pixel. In some embodiments, various suitable modifications may be made and, for example, six or seven TFTs may be employed for a single pixel.

The semiconductor layers A1 and A2 may include amorphous silicon or polycrystalline silicon. According to another embodiment, the semiconductor layers A1 and A2 may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layers A1 and A2 may include a channel region, and a source region and a drain region each having a higher carrier concentration than the channel region.

The first gate electrode G1 is disposed on the semiconductor layer A1 with a first gate insulating layer 103 therebetween. The first gate electrode G1 may include, for example, molybdenum (Mo), aluminum (Al), copper (Cu), or titanium (Ti), and may include a single layer or multiple layers. For example, the first gate electrode G1 may include a single layer of Mo.

The first gate insulation layer 103 insulates the semiconductor layer A1 from the first gate electrode G1, and may include silicon oxide (e.g., $SiO_2$), silicon nitride (e.g., $SiN_x$), silicon oxynitride (e.g., SiON), aluminum oxide (e.g., $Al_2O_3$), titanium oxide (e.g., $TiO_2$), tantalum oxide (e.g., $Ta_2O_5$), hafnium oxide (e.g., $HfO_2$), zinc oxide (e.g., $ZnO_2$), and/or the like.

The second gate electrode G2 is disposed on the semiconductor layer A2 with the first gate insulating layer 103 and a second gate insulating layer 105 therebetween. The second gate electrode G2 may include a conductive material including Mo, Al, Cu, and Ti, and may be a multi-layer or single layer including the aforementioned materials. For example, the second gate electrode G2 may include a single layer of Mo or a multi-layer structure of Mo/Al/Mo.

The second gate insulating layer 105 may include an inorganic material including oxide or nitride. For example, the second gate insulating layer 105 may include silicon oxide (e.g., $SiO_2$), silicon nitride (e.g., $SiN_x$), silicon oxynitride (e.g., SiON), aluminum oxide (e.g., $Al_2O_3$), titanium oxide (e.g., $TiO_2$), tantalum oxide (e.g., $Ta_2O_5$), hafnium oxide (e.g., $HfO_2$), zinc oxide (e.g., $ZnO_2$), and/or the like.

The source electrodes S1 and S2 and the drain electrodes D1 and D2 are disposed on an interlayer insulating layer 107. Each of the source electrodes S1 and S2 and the drain electrodes D1 and D2 may include a conductive material including Mo, Al, Cu, and Ti, and may be a multi-layer or single layer including the aforementioned materials. For example, each of the source electrodes S1 and S2 and the drain electrodes D1 and D2 may be a multi-layer of Ti/Al/Ti.

The interlayer insulating layer 107 may include silicon oxide (e.g., $SiO_2$), silicon nitride (e.g., $SiN_x$), silicon oxynitride (e.g., SiON), aluminum oxide (e.g., $Al_2O_3$), titanium oxide (e.g., $TiO_2$), tantalum oxide (e.g., $Ta_2O_5$), hafnium oxide (e.g., $HfO_2$), zinc oxide (e.g., $ZnO_2$), and/or the like.

As described above, the first gate electrode G1 of the first TFT T1 and the second gate electrode G2 of the second TFT T2 may be disposed on different layers. Accordingly, driving ranges of the first TFT T1 and the second TFT T2 may be differently controlled.

A first electrode CE1 of a storage capacitor Cst may be formed on the same layer as the first gate electrode G1, and may include the same or substantially the same material as the first gate electrode G1. A second electrode CE2 of the storage capacitor Cst overlaps the first electrode CE1 with the second gate insulating layer 105 therebetween. The second electrode CE2 may be formed on the same layer as the second gate electrode G2, and may include the same or substantially the same material as the second gate electrode G2.

In FIG. 2A, the storage capacitor Cst is not overlapped with the first TFT T1 and the second TFT T2. However, the present invention is not limited thereto. For example, the storage capacitor Cst may be overlapped with the first TFT T1. In some embodiments, the first electrode CE1 of the storage capacitor Cst may be integrally formed with the first gate electrode G1. In other words, the first gate electrode G1 of the first TFT T1 may function as the first electrode CE1 of the storage capacitor Cst.

A planarization layer 109 may be positioned on the source electrodes S1 and S2 and the drain electrodes D1 and D2, and an organic light-emitting device (OLED) may be positioned on the planarization layer 109. The planarization layer 109 may include a single layer including an organic material or a multi-layer formed by stacking single layers including an organic material. The organic material may include a commercial polymer (such as polymethyl methacrylate (PMMA) or polystyrene (PS)), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, and/or the like. The planarization layer 109 may be a complex stack of an inorganic insulation layer and an organic insulation layer.

An OLED 300 may be disposed on the planarization layer 109, within the display area DA of the substrate 100. The OLED 300 includes a pixel electrode 310, an opposite electrode 330, and an intermediate layer 320 between the pixel electrode 310 and the opposite electrode 330, the intermediate layer 320 including an emission layer. The pixel electrode 310 contacts one of the source electrode S1 and the drain electrode D1 of the first TFT T1 via an opening formed in the planarization layer 109, and is electrically connected to the first TFT T1.

The pixel electrode 310 may be a reflection electrode. For example, the pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide (e.g., $In_2O_3$), indium gallium oxide (IGO), and aluminum zinc oxide (AZO).

A pixel-defining layer 112 may be disposed on the planarization layer 109. The pixel-defining layer 112 defines pixels by including respective openings corresponding to sub-pixels, namely, an opening via which a center portion of at least the pixel electrode 310 is exposed. The pixel-defining layer 112 prevents or substantially prevents an arc from occurring on the edge of the pixel electrode 310 by increasing a distance between the edge of the pixel electrode 310 and the opposite electrode 330 disposed over the pixel electrode 310. The pixel-defining layer 112 may be formed of an organic material, for example, polyimide or hexamethyldisiloxane (HMDSO).

The intermediate layer 320 of the OLED 300 may include a low-molecular weight or high-molecular weight material. When the intermediate layer 320 includes a low-molecular weight material, the intermediate layer 320 may have a structure in which a hole injection layer (HIL), a hole transport layer (HTL), an emission layer (EML), an electron transport layer (ETL), and an electron injection layer (EIL) are stacked in a single or complex structure, and may include various suitable organic materials including copper phthalocyanine (CuPc), N,N'-Di(naphthalene-1-yl)-N,N'-diphenyl-benzidine (NPB), and tris-8-hydroxyquinoline aluminum (Alq3). These layers may be formed by vacuum deposition.

When the intermediate layer 320 includes a high-molecular weight material, the intermediate layer 320 may generally include an HTL and an EML. In this case, the HTL may include poly(ethylenedioxythiophene) (PEDOT), and the EML may include a high-molecular weight material such as a polyphenylenevinylene (PPV)-based material or a polyfluorene-based material. The intermediate layer 320 may be formed by screen printing, inkjet printing, laser induced thermal imaging (LITI), and/or the like.

The intermediate layer 320 is not limited to the structure described above, and may have any of various other suitable structures. The intermediate layer 320 may include a single layer that covers a plurality of pixel electrodes 310 or may include patterned layers respectively corresponding to the plurality of pixel electrodes 310.

The opposite electrode 330 is disposed on the display area DA. As illustrated in FIG. 2A, the opposite electrode 330 may cover the display area DA. In other words, the single opposite electrode 330 may be included for a plurality of OLEDs 300 and may correspond to the plurality of pixel electrodes 310.

The opposite electrode 330 (or common electrode 330) may be a transparent electrode. The opposite electrode 330 may be a transparent or semi-transparent electrode, and may be a metal thin film having a small work function, including lithium (Li), calcium (Ca), lithium fluoride/calcium (e.g., LiF/Ca), lithium fluoride/aluminum (e.g., LiF/Al), aluminum (Al), silver (Ag), magnesium (Mg), or a combination thereof. A transparent conductive oxide (TCO) layer including, for example, indium tin oxide (ITO), indium zinc oxide (IZO), zinc oxide (ZnO), or indium oxide (e.g., $In_2O_3$) may be further disposed on the metal thin film.

As the pixel electrode 310 is a reflection electrode and the opposite electrode 330 is a transparent electrode, the display apparatus may be of a top-emission type in which light emitted by the intermediate layer 320 may be emitted toward the opposite electrode 330. However, the present embodiment is not limited thereto, and the display apparatus may be a bottom-emission type in which the light emitted by the organic emission layer is emitted toward the substrate 100. In this case, the pixel electrode 310 may be a transparent or semi-transparent electrode, and the opposite electrode 330 may be a reflection electrode. The display apparatus according to the present embodiment may be of a dual emission type that emits light in both directions, namely, toward the top surface and the bottom surface of the display apparatus.

The thin film encapsulation layer 400 may cover the display area DA and the peripheral area PA to prevent or reduce infiltration of external moisture and oxygen. The thin film encapsulation layer 400 may include at least one organic encapsulation layer and at least one inorganic encapsulation layer. Although the thin film encapsulation layer 400 includes two inorganic encapsulation layers 410 and 430 and a single organic encapsulation layer 420 in FIG. 2A, the order in which the inorganic encapsulation layers 410-430 are stacked and the number of times the inorganic encapsulation layers 410-430 are stacked are not limited to the embodiment of FIG. 2A.

The first inorganic encapsulation layer 410 may cover the opposite electrode 330 and may include silicon oxide, silicon nitride, and/or silicon oxynitride. Other suitable layers (e.g., a capping layer) may be disposed between the first inorganic encapsulation layer 410 and the opposite electrode 330. Because the first inorganic encapsulation layer 410 is formed on structures below the first inorganic encapsulation layer 410, the upper surface thereof may not be flat. The organic encapsulation layer 420 covers the first inorganic encapsulation layer 410. The organic encapsulation layer 420 may have a substantially flat upper surface. In detail, a portion of the organic encapsulation layer 420 corresponding to the display area DA may have a substantially flat upper surface. The organic encapsulation layer 420 may include at least one material from among polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include silicon oxide, silicon nitride, and/or silicon oxynitride.

As such, because the thin film encapsulation layer 400 includes the first inorganic encapsulation layer 410, the organic encapsulation layer 420, and the second inorganic encapsulation layer 430, even when the thin film encapsulation layer 400 cracks due to this multi-layered structure, this crack may not be connected between the first inorganic encapsulation layer 410 and the organic encapsulation layer 420 or between the organic encapsulation layer 420 and the second inorganic encapsulation layer 430. Accordingly, formation of a path via which external moisture, oxygen, and/or the like permeates into the display area DA and the peripheral area PA may be prevented, minimized, or reduced. An edge of the second inorganic encapsulation layer 430 outside the display area DA may contact the first inorganic encapsulation layer 410 so that the organic encapsulation layer 420 may not be exposed to the outside.

Wiring 210, a dam unit 120 (e.g., a dam 120), and an organic material detection part 220 are disposed on the peripheral area PA of the substrate 100. The wiring 210 may be wiring for supplying power to the display area DA, and may be formed on the same layer as the source electrodes S1 and S2 and the drain electrodes D1 and D2, and may include the same or substantially the same material as the source electrodes S1 and S2 and the drain electrodes D1 and D2. In some embodiments, the wiring 210 may be connected to the opposite electrode 330 of the OLED 300 and transmit a common voltage ELVSS to the opposite electrode 330. In FIG. 2A, the wiring 210 is connected to the opposite electrode 330 via a connection line 116. In this case, the connection line 116 may be formed of the same or substantially the same material as the pixel electrode 310 and at the same time when the pixel electrode 310 is formed. However, the present invention is not limited thereto, and various suitable modifications may be made to the wiring 210. For example, the wiring 210 may directly contact the opposite electrode 330.

The dam unit 120 may cover at least a portion of the wiring 210. In some embodiments, the dam unit 120 may cover an edge of the wiring 210 that is far from the display area DA, and may not cover an edge of the wiring 210 that is adjacent to the display area DA. However, the present invention is not limited thereto. Various suitable modifications may be made to the dam unit 120, and, for example, the dam unit 120 may cover the entire wiring 210.

The dam unit 120 may block an organic material from flowing toward the edge of the substrate 100 when the organic encapsulation layer 420 of the thin film encapsulation layer 400, for encapsulating the display area DA and the peripheral area PA, is formed, thereby preventing formation of an edge tail of the organic encapsulation layer 420.

The dam unit 120 may be formed of a plurality of layers. A first layer 121 may be formed of the same or substantially the same material as the planarization layer 109, and a second layer 123 on the first layer 121 may be formed of the same or substantially the same material as the pixel-defining layer 112. As described above, the planarization layer 109 and the pixel-defining layer 112 may include an organic material. The organic material has a higher bonding strength with metal than with an inorganic material used to form the interlayer insulating layer 107. Accordingly, because the dam unit 120 overlaps and contacts an edge of the wiring 210 formed of metal, the dam unit 120 may be stably formed with high bonding strength. Although the dam unit 120 includes a plurality of layers in FIG. 2A, the dam unit 120 may include a single layer. In this case, the dam unit 120 may be formed of the same or substantially the same material as the planarization layer 109 or the pixel-defining layer 112.

The organic material detection part 220 is disposed outside the dam unit 120 and includes at least one detection unit, for example, detection units 221, 223, 225, and 227 (e.g., at least one detector, for example, detectors 221, 223, 225, and 227). When the organic encapsulation layer 420 is formed, the organic material detection part 220 may detect the degree to which an organic material overflows without being blocked by the dam unit 120. Additionally, when an edge of the substrate 100 is cut, the organic material detection part 220 may prevent or reduce propagation of cracks. Each of the first inorganic encapsulation layer 410 and the second inorganic encapsulation layer 430 over the organic material detection part 220 may be curved in a thickness direction (z direction) of the organic material detection part 220. An infiltration path of external moisture and/or oxygen is thereby lengthened, and thus infiltration of external moisture and/or oxygen into the display area DA may be prevented, minimized, or reduced.

The detection units 221, 223, 225, and 227 protrude from an upper surface of the substrate 100. When a conductive layer is formed in the display area DA, the detection units 221, 223, 225, and 227 may also be formed on the same layer as the conductive layer. For example, the detection units 221, 223, 225, and 227 may be formed by overlapping a first layer 221a, which is formed on the same layer as the first gate electrode G1, and a second layer 221b, which is formed on the same layer as the second gate electrode G2, with each other. The second gate insulating layer 105 may be disposed between the first layer 221a and the second layer 221b, and the interlayer insulating layer 107 may be disposed over the first layer 221a. The second gate insulating layer 105 and the interlayer insulating layer 107 are formed along (e.g., formed on or formed over) the shapes of the first layer 221a and the second layer 221b and thus protrude from the upper surface of the substrate 100. A height of the organic material detection part 220 from the upper surface of the substrate 100 may be less than that of the dam unit 120 from the upper surface of the substrate 100.

To facilitate detection of an organic material by the organic material detection part 220, a step difference may be formed around the organic material detection part 220. In other words, this step difference may facilitate flow of the organic material into the organic material detection part 220. To this end, the first inorganic encapsulation layer 410 disposed on the organic material detection part 220 includes an opening 410h. In other words, the opening 410h faces at least a portion of the organic material detection part 220, and thus the organic material that overflows while the organic encapsulation layer 420 is being formed may easily flow into the opening 410h.

The opening 410h may face a first detection unit 221 (e.g., a first detector 221) among the detection units 221, 223, 225, and 227, because the first detection unit 221 is closer to the display area DA than the other detection units 223, 225, and 227, and a larger amount of organic material may concentrate in the first detection unit 221 than the other detection units 223, 225, and 227 when considering the direction of flow of the overflowing organic material. However, the present invention is not limited thereto. Various suitable modifications may be made to the opening 410h, and, for example, the opening 410h may be formed to face the other detection units 223, 225, and 227 or to face at least two of the detection units 221, 223, 225, and 227. The organic material that overflows when the organic encapsulation layer 420 is formed may be disposed in the opening 410h. When the organic material does not overflow, the second inorganic encapsulation layer 430 may be disposed in the opening 410h.

Figure 2B:
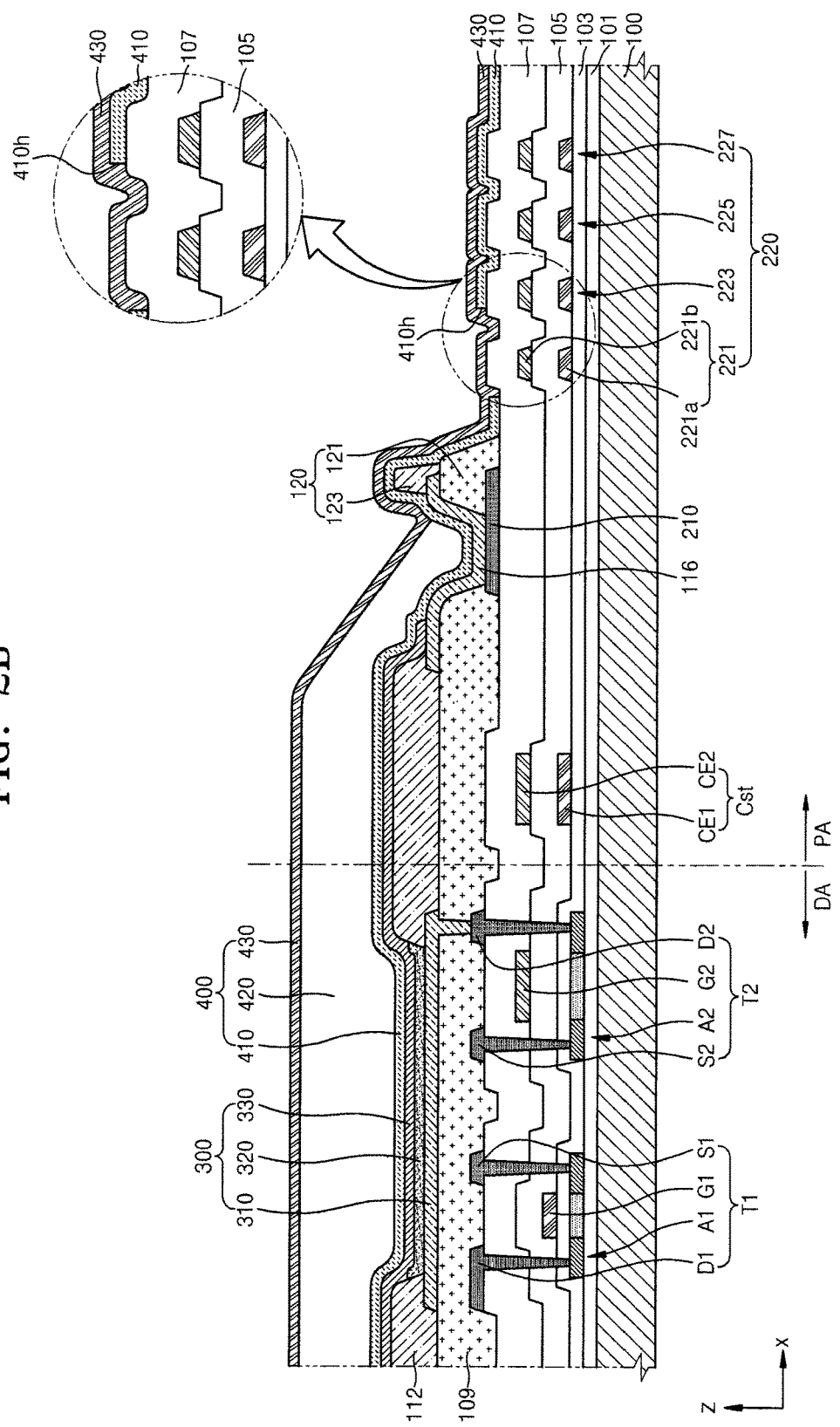
FIG. 2B is a cross-sectional view of a display apparatus according to another embodiment.

FIG. 2B is a cross-sectional view of a display apparatus according to another embodiment. The same reference numerals in FIG. 2A and FIG. 2B denote the same elements and repeated descriptions thereof may be omitted.

Referring to FIG. 2B, the connection line 116 connected to the wiring 210 may extend to be over the first layer 121 of the dam unit 120. Accordingly, the connection line 116 has a wide area that contacts the wiring 210, and thus may reduce contact resistance between the wiring 210 and the connection line 116. When the first layer 121 of the dam unit 120 is formed of the same or substantially the same material as the planarization layer 109, the connection line 116 may be understood as being connected to the wiring 210 via a through hole 190h (see FIG. 9) that extends through the planarization layer 109.

As the connection line 116 extends to be over the first layer 121 of the dam unit 120, the dam unit 120 may have a structure in which the first layer 121, the connection line 116, and the second layer 123 are sequentially stacked.

Figure 3A:
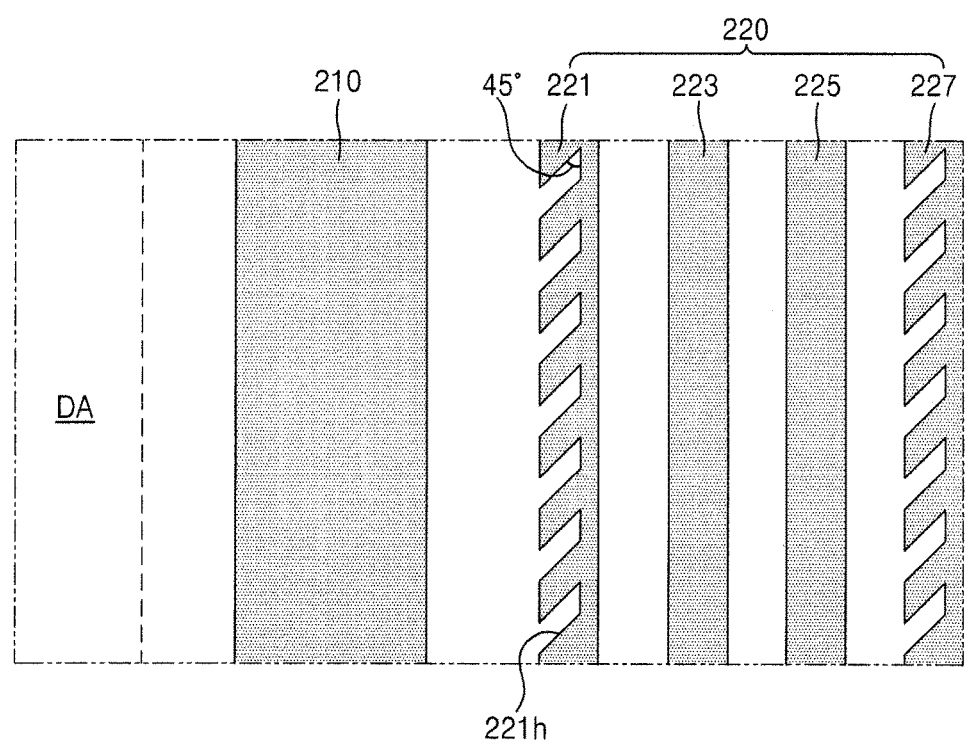
FIG. 3A is a plan view of an organic material detection part, according to another embodiment.
Figure 3B:
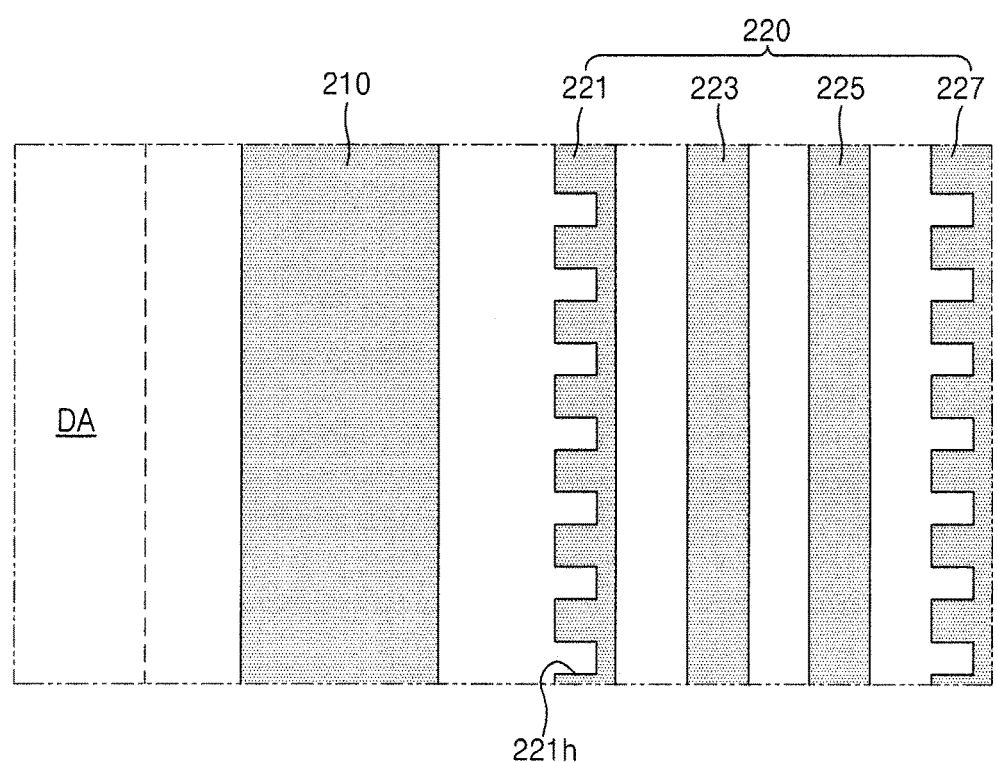
FIG. 3B is a plan view of an organic material detection part, according to another embodiment.
Figure 3C:
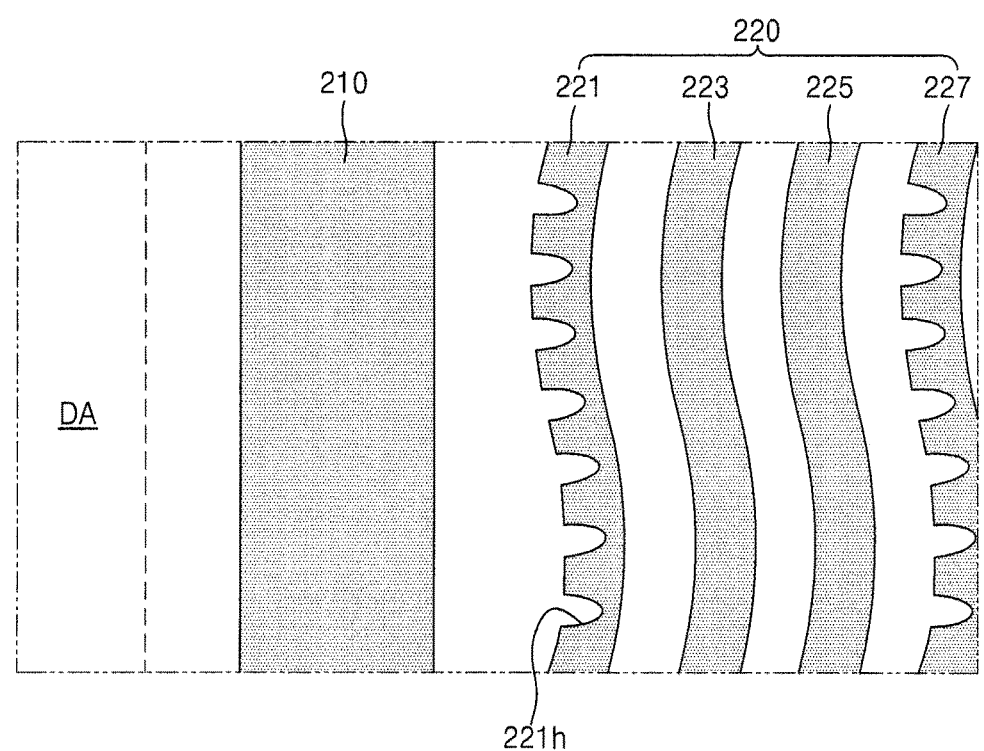
FIG. 3C is a plan view of an organic material detection part, according to another embodiment.

FIGS. 3A-3C are plan views of the organic material detection part 220, according to embodiments. Referring to FIG. 3A, in the organic material detection part 220, at least some of the detection units 221, 223, 225, and 227 are arranged along the edge of the display area DA. A plurality of detection units 221, 223, 225, and 227 may be disposed. In this case, the detection units 221, 223, 225, and 227 may be spaced apart from one another and may each have a straight line shape. When the plurality of detection units 221, 223, 225, and 227 are included, not only detection of the organic material but also prevention of infiltration of ambient air or propagation of cracks may be improved.

At least one of the detection units 221, 223, 225, and 227 may include a groove pattern 221h in an area adjacent to the display area. When the organic material flows into the groove pattern 221h, the groove pattern 221h may enable easy visual recognition of whether there is an inflow of the organic material or not. In other words, the organic material that overflows when the organic encapsulation layer 420 is formed may flow into the groove pattern 221h, and, in this case, the groove pattern 221h may be checked to easily visually recognize whether the organic material has flowed into the groove pattern 221h.

The detection unit 221 may be a straight line that extends along the edge of the display area DA in a first direction, and the groove pattern 221h may be formed at a certain angle with respect to the first direction, for example, at an angle of 45 degrees. However, the shapes of the detection unit 221 and the groove pattern 221h are not limited thereto.

As shown in FIG. 36, the groove pattern 221h may be formed at a 90-degree angle to the extending direction of the detection unit 221. Further, as shown in FIG. 3C, the detection units 221, 223, 225, and 227 may be curved. In other words, various suitable modifications may be made to the shapes of the detection unit 221 and the groove pattern 221*h*.

As such, the degree to which the organic material is detected by the organic material detection part 220 is checked so that the amount of the organic material used to form the organic encapsulation layer 420 may be optimally controlled. In addition, according to the amount of the organic material detected, an interfacial process may be conducted on an upper portion of the dam unit 120 or a surface of the organic encapsulation layer 420.

The planar shapes of the organic material detection part 220 described above with reference to FIGS. 3A-3C may be applicable to embodiments which will be described later.

Figure 4:
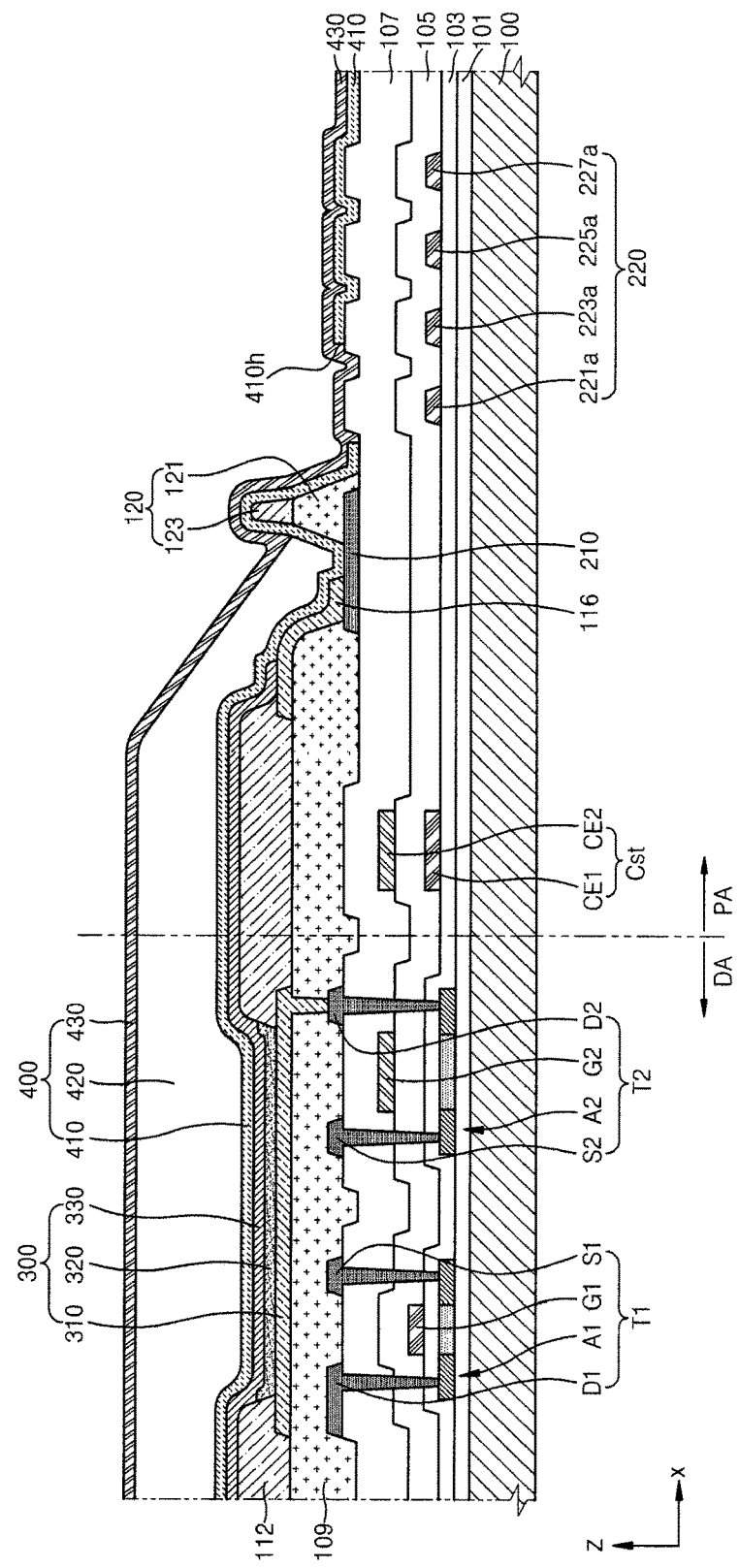
FIG. 4 is a cross-sectional view of a display apparatus according to another embodiment.

FIG. 4 is a cross-sectional view of a display apparatus according to another embodiment. The same reference numerals in FIG. 2A and FIG. 4 denote the same elements and repeated descriptions thereof may be omitted.

Referring to FIG. 4, the display apparatus according to the present embodiment includes the organic material detection part 220 arranged outside the dam unit 120, and the first inorganic encapsulation layer 410 includes the opening 410*h* that faces at least a portion of the organic material detection part 220. In FIG. 4, the organic material detection part 220 is not formed by overlapping a plurality of conductive layers with one another, but includes at least one detection unit, namely, detection units 221*a*, 223*a*, 225*a*, and 227*a*, formed on the same layer as the first gate electrode G1 and of the same or substantially the same material as the first gate electrode G1. Also in FIG. 4, the second gate insulating layer 105 and the interlayer insulating layer 107 disposed on the detection units 221*a*, 223*a*, 225*a*, and 227*a* protrude from the upper surface of the substrate 100 by a thickness of each of the detection units 221*a*, 223*a*, 225*a*, and 227*a*.

Accordingly, the organic material detection part 220 may perform an organic material detecting function, a crack propagation preventing function, and an ambient air infiltration preventing function.

Figure 5:
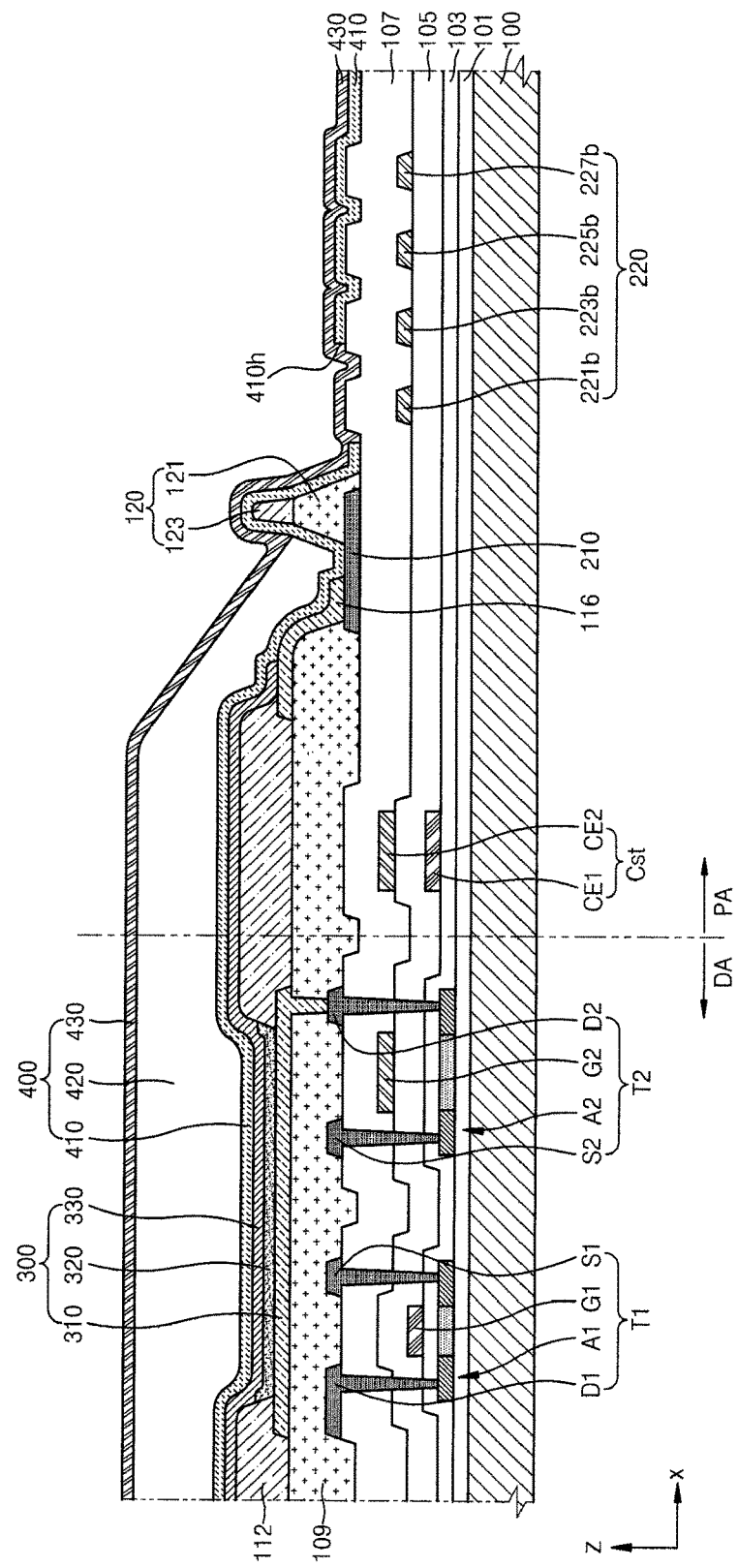
FIG. 5 is a cross-sectional view of a display apparatus according to another embodiment.

FIG. 5 is a cross-sectional view of a display apparatus according to another embodiment. The same reference numerals in FIG. 2A and FIG. 5 denote the same elements and repeated descriptions thereof may be omitted.

Referring to FIG. 5, the display apparatus according to the present embodiment includes the organic material detection part 220 arranged outside the dam unit 120, and the first inorganic encapsulation layer 410 includes the opening 410*h* that faces at least a portion of the organic material detection part 220. In FIG. 5, the organic material detection part 220 is not formed by overlapping a plurality of conductive layers with one another, but includes at least one detection unit, namely, detection units 221*b*, 223*b*, 225*b*, and 227*b*, formed on the same layer as the second gate electrode G2 and of the same or substantially the same material as the second gate electrode G2. Also in FIG. 5, the interlayer insulating layer 107 disposed on the detection units 221*b*, 223*b*, 225*b*, and 227*b* protrudes from the upper surface of the substrate 100 by a thickness of each of the detection units 221*b*, 223*b*, 225*b*, and 227*b*.

Accordingly, the organic material detection part 220 may perform an organic material detecting function, a crack propagation preventing function, and an ambient air infiltration preventing function.

Figure 6:
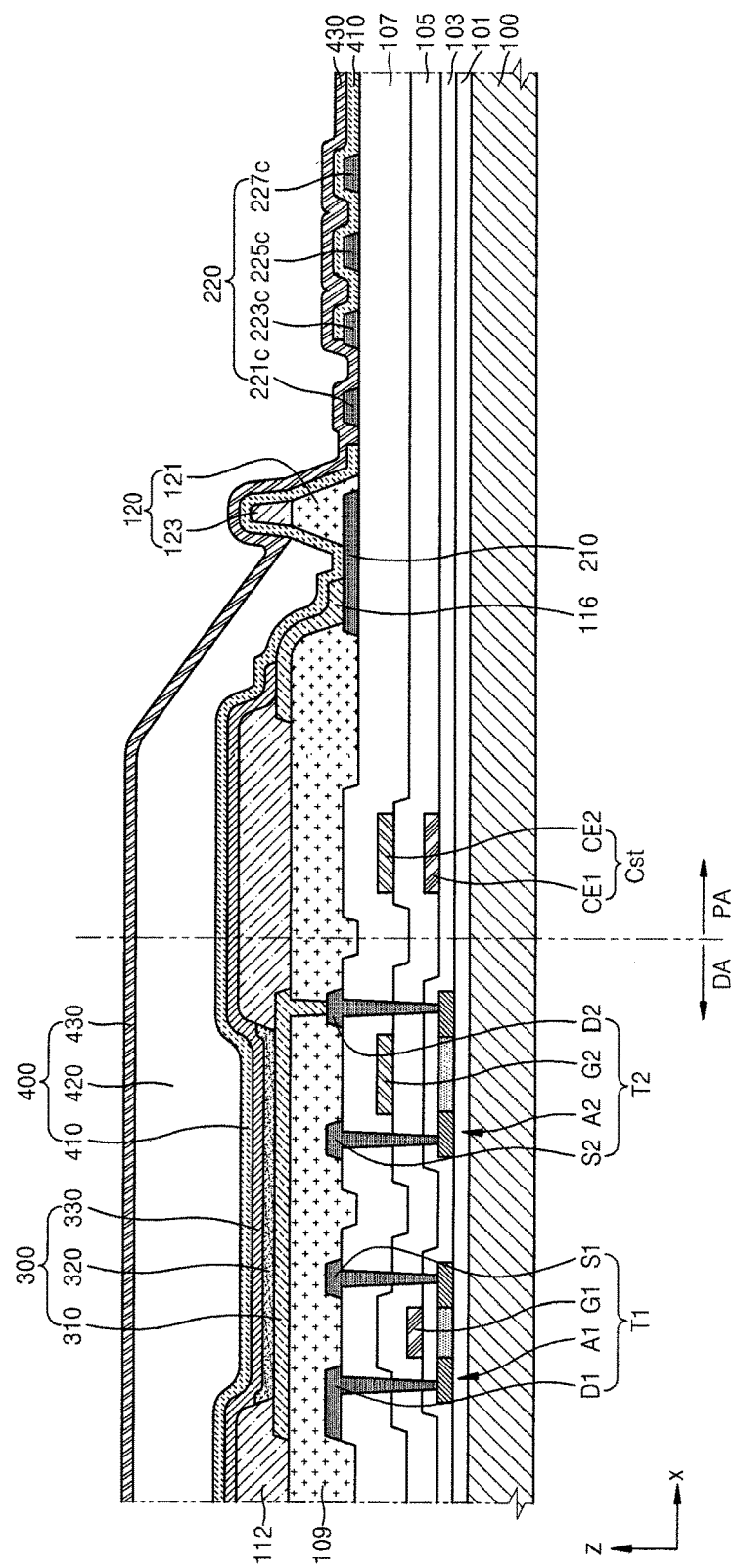
FIG. 6 is a cross-sectional view of a display apparatus according to another embodiment.

FIG. 6 is a cross-sectional view of a display apparatus according to another embodiment. The same reference numerals in FIG. 2A and FIG. 6 denote the same elements and repeated descriptions thereof may be omitted.

Referring to FIG. 6, the display apparatus according to the present embodiment includes the organic material detection part 220 arranged outside the dam unit 120, and the first inorganic encapsulation layer 410 includes the opening 410*h* (see FIG. 2A) that faces at least a portion of the organic material detection part 220. In FIG. 6, the organic material detection part 220 includes at least one detection unit, namely, detection units 221*c*, 223*c*, 225*c*, and 227*c*, and the detection units 221*c*, 223*c*, 225*c*, and 227*c* may be formed on the same layer as the source electrodes S1 and S2 or the drain electrodes D1 or D2, of the same or substantially the same material as the source electrodes S1 and S2 or the drain electrodes D1 or D2. In this case, the detection units 221*c*, 223*c*, 225*c*, and 227*c* may be disposed on the same level as the wiring 210 and may be spaced apart from the wiring 210.

Figure 7:
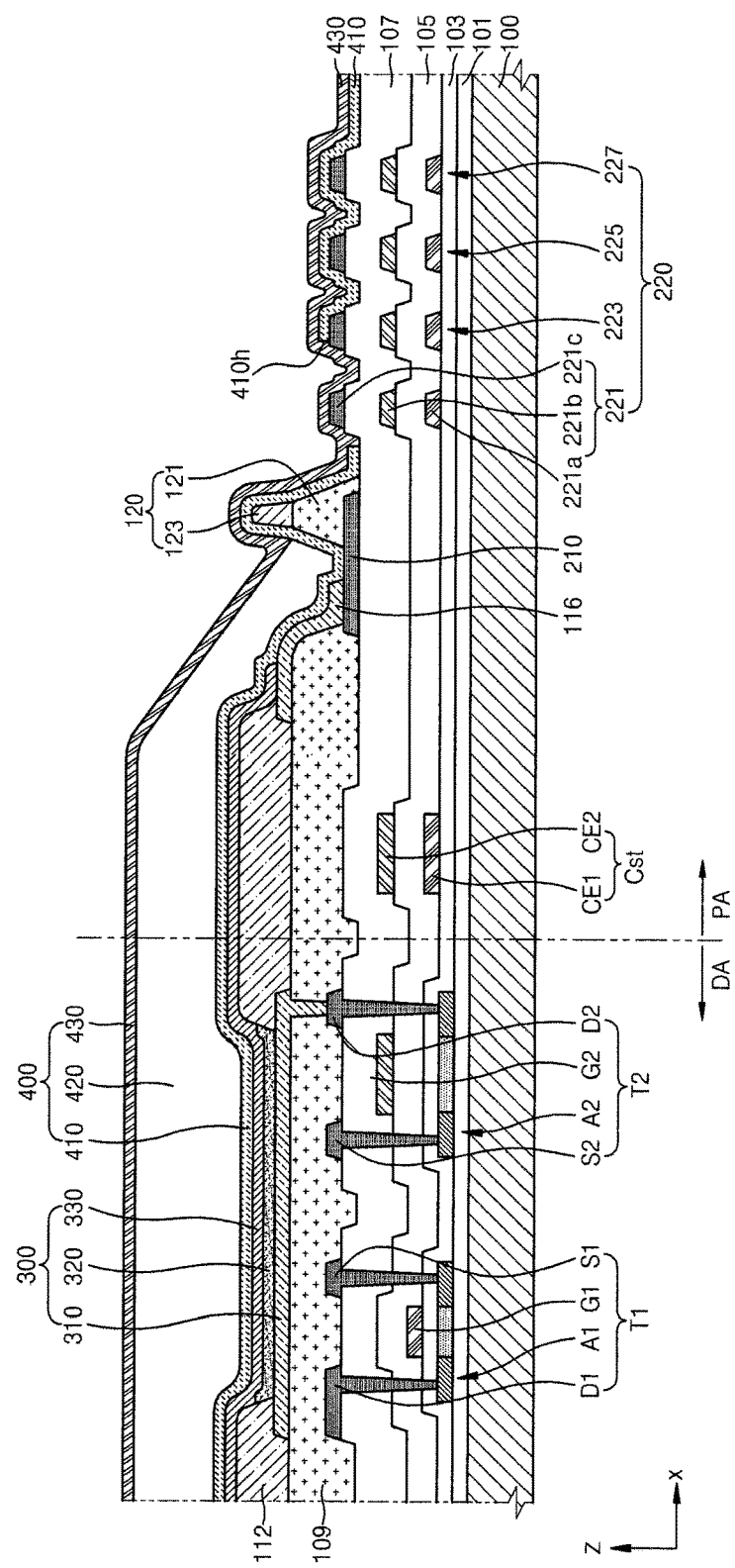
FIG. 7 is a cross-sectional view of a display apparatus according to another embodiment.

FIG. 7 is a cross-sectional view of a display apparatus according to another embodiment. The same reference numerals in FIG. 2A and FIG. 7 denote the same elements and repeated descriptions thereof may be omitted.

Referring to FIG. 7, the display apparatus according to the present embodiment includes the organic material detection part 220 arranged outside the dam unit 120, and the first inorganic encapsulation layer 410 includes the opening 410*h* that faces at least a portion of the organic material detection part 220. In FIG. 7, the organic material detection part 220 may include at least one detection unit, namely, detection units 221, 223, 225, and 227. The detection units 221, 223, 225, and 227 may include a first layer 221*a* disposed on the same layer as the first gate electrode G1, a second layer 221*b* disposed on the same layer as the second gate electrode G2, and a third layer 221*c* disposed on the same layer as the source electrodes S1 and S2 or the drain electrodes D1 and D2. The first layer 221*a*, the second layer 221*b*, and the third layer 221*c* may overlap with one another. Accordingly, the organic material detection part 220 may protrude from the upper surface of the substrate 100. Various suitable modifications may be made to the detection units 221, 223, 225, and 227, for example, each detection unit may include only two of the first layer 221*a*, the second layer 221*b*, and the third layer 221*c*.

According to this structure, the organic material detection part 220 may perform an organic material detecting function, a crack propagation preventing function, and an ambient air infiltration preventing function.

Figure 8:
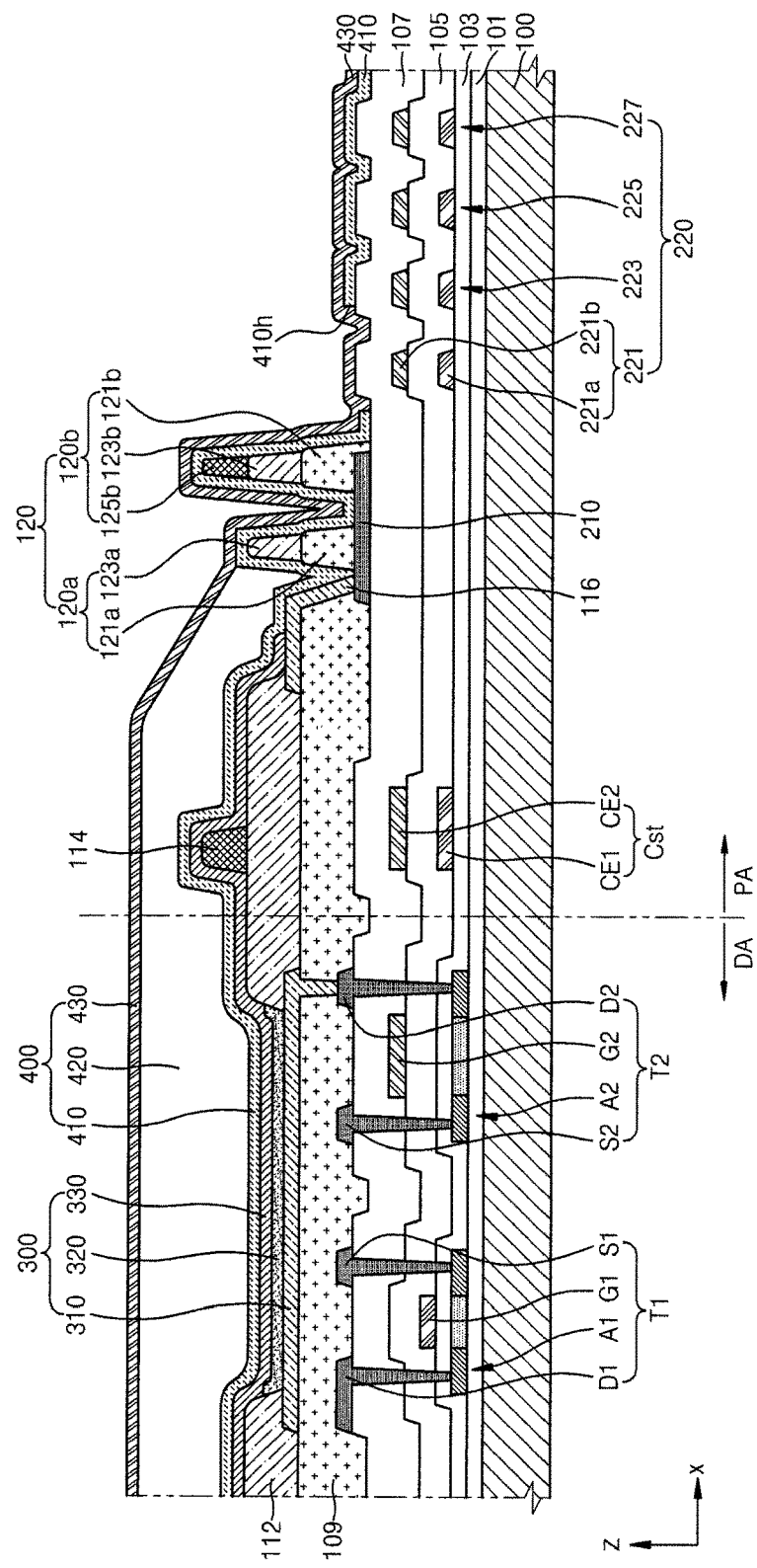
FIG. 8 is a cross-sectional view of a display apparatus according to another embodiment.

FIG. 8 is a cross-sectional view of a display apparatus according to another embodiment. The same reference-numerals in FIG. 2A and FIG. 8 denote the same elements and repeated descriptions thereof may be omitted.

Referring to FIG. 8, the display apparatus according to the present embodiment includes the organic material detection part 220 arranged outside the dam unit 120, and the first inorganic encapsulation layer 410 includes the opening 410*h* that faces at least a portion of the organic material detection part 220.

According to the present embodiment, the dam unit 120 includes a first dam 120*a* and a second dam 120*b* spaced apart from each other (e.g., the second dam is spaced from the first dam). The display area DA may further include a spacer 114 disposed on the pixel-defining layer 112. The spacer 114 protrudes from the pixel-defining layer 112 toward the thin film encapsulation layer 400, and may prevent or substantially prevent generation of a defect due to mask damage during the manufacture of the display apparatus. The spacer 114 may be formed of an organic material, for example, polyimide or HMDSO.

The first dam 120*a* and the second dam 120*b* may be arranged on the wiring 210 in the peripheral area PA, and one of the first dam 120a and the second dam 120b may cover an edge of the wiring 210. At least one of the first dam 120a and the second dam 120b may include a plurality of layers. In FIG. 8, the first dam 120a is a stack of a first layer 121a formed of the same or substantially the same material as the planarization layer 109 and a second layer 123a formed of the same or substantially the same material as the pixel-defining layer 112, and the second dam 120b is a stack of a first layer 121b formed of the same or substantially the same material as the planarization layer 109, a second layer 123b formed of the same or substantially the same material as the pixel-defining layer 112, and a third layer 125b formed of the same or substantially the same material as the spacer 114. However, the present invention is not limited thereto. One of the first dam 120a and the second dam 120b may include a single layer, or each of them may have a double-layer structure or a triple-layer structure. In this way, various suitable modifications may be made to the structures of the first and second dams 120a and 120b. The dam unit 120 may further include an additional dam spaced apart from the first dam 120a and the second dam 120b.

As the dam unit 120 includes a plurality of dams, overflow of the organic material when the organic encapsulation layer 420 is formed may be more effectively prevented. Also in this case, the organic material detection part 220 may detect the organic material, and accordingly, the structure of the dam unit 120 may be changed or optimal conditions for the amount of the organic material may be secured.

Figure 9:
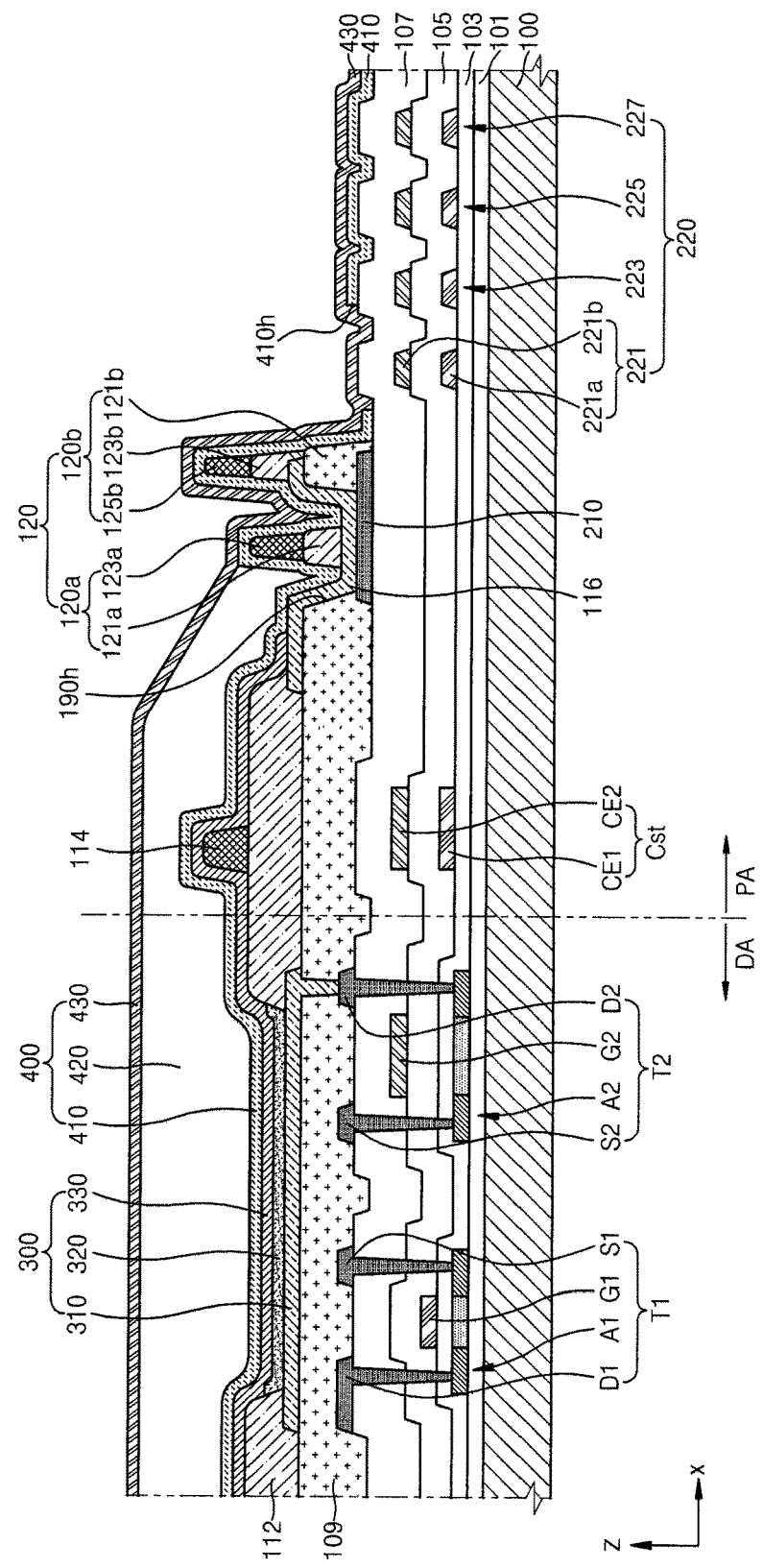
FIG. 9 is a cross-sectional view of a display apparatus according to another embodiment.

FIG. 9 is a cross-sectional view of a display apparatus according to another embodiment. The same reference numerals in FIG. 8 and FIG. 9 denote the same elements and repeated descriptions thereof may be omitted.

Referring to FIG. 9, the connection line 116 connected to the wiring 210 may extend to be over the first layer 121b of the second dam 120b. Accordingly, the connection line 116 has a wide area that contacts the wiring 210, and thus may reduce contact resistance between the wiring 210 and the connection line 116. When the first layer 121b of the second dam 120b is formed of the same or substantially the same material as the planarization layer 109, the connection line 116 may be understood as being connected to the wiring 210 via a through hole 190h that extends through the planarization layer 109.

As the connection line 116 extends to be over the first layer 121b of the second dam 120b, the second dam 120b may have a structure in which the first layer 121b, the connection line 116, the second layer 123b, and the third layer 125b are sequentially stacked.

In FIG. 9, the first dam 120a may be disposed on the connection line 116 within the through hole 190h of the planarization layer 109. In this case, the first layer 121a of the first dam 120a may be formed of the same or substantially the same material as the pixel-defining layer 112 and formed concurrently (e.g., simultaneously) with the pixel-defining layer 112, and the second layer 123a of the first dam 120a may be formed of the same or substantially the same material as the spacer 114 and formed simultaneously with the spacer 114.

According to this structure, a contact resistance between the connection line 116 and the wiring 210 may be reduced, and also the dam unit 120 may include a plurality of dams. As the dam unit 120 includes a plurality of dams, overflow of the organic material when the organic encapsulation layer 420 is formed may be more effectively prevented. Also in this case, the organic material detection part 220 may detect the organic material, and accordingly, the structure of the dam unit 120 may be changed or optimal conditions for the amount of the organic material may be secured.

Figure 10:
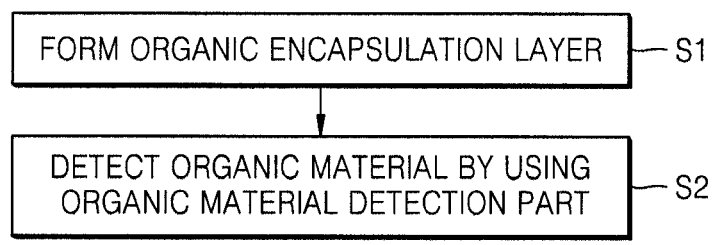
FIG. 10 is a flowchart of an organic material detecting method according to an embodiment.

FIG. 10 is a flowchart of an organic material detecting method according to an embodiment. Referring to FIG. 10, the organic material detecting method includes an organic encapsulation layer forming operation S1, and an organic material detecting operation S2 performed by the organic material detection part 220.

The organic encapsulation layer forming operation S1 is performed when the thin film encapsulation layer 400 of FIG. 2A is formed. In operation S1, the organic encapsulation layer 420 of FIG. 2A may cover at least a portion of the display area DA and the peripheral area PA. A portion of the organic encapsulation layer 420 corresponding to the display area DA may have a substantially flat upper surface (e.g., a flat upper surface). The organic encapsulation layer 420 may include at least one material from among polyethylene terephthalate, polyethylene naphthalate, polycarbonate, polyimide, polyethylene sulfonate, polyoxymethylene, polyarylate, and hexamethyldisiloxane. The organic encapsulation layer 420 may be formed in the display area DA and the peripheral area PA via coating or deposition. For example, the organic encapsulation layer 420 may be formed via flash evaporation, inkjet printing, or slot die coating.

While the organic encapsulation layer 420 is being formed, the organic material used to form the organic encapsulation layer 420 may proceed over the dam unit 120 and reach the organic material detection part 220. To detect this organic material, the organic material detection part 220 of FIG. 2A performs the organic material detecting operation S2.

In the organic material detecting operation S2, the organic material may be checked via the organic material detection part 220.

According to an embodiment, the organic material detecting operation S2 may be performed by measuring a step difference of the organic material detection part 220 and checking the degree of overflow of the organic material. Since the organic material detection part 220 includes the detection units 221, 223, 225, and 227, each protruding from the upper surface of the substrate 100, the degree of overflow of the organic material may be checked by comparing heights of the detection units 221, 223, 225, and 227 before formation of the organic encapsulation layer 420 with those of the detection units 221, 223, 225, and 227 after formation of the organic encapsulation layer 420.

To facilitate detection of an organic material by the organic material detection part 220, a step difference may be formed around the organic material detection part 220. In other words, this step difference may facilitate flow of the organic material into the organic material detection part 220. To this end, the first inorganic encapsulation layer 410 disposed on the organic material detection part 220 includes an opening 410h. In other words, the opening 410h faces at least a portion of the organic material detection part 220, and thus the organic material that overflows while the organic encapsulation layer 420 is being formed may easily flow into the opening 410h.

The opening 410h may face a first detection unit 221 (e.g., a first detector 221) among the detection units 221, 223, 225, and 227, because the first detection unit 221 is closer to the display area DA than the other detection units 223, 225, and 227, and a larger amount of organic material may concentrate in the first detection unit 221 than the other detection units 223, 225, and 227 when considering the direction of flow of the overflowing organic material. However, the present invention is not limited thereto. Various suitable modifications may be made to the opening 410*h*, and, for example, the opening 410*h* may be formed to face the other detection units 223, 225, and 227 or to face at least two of the detection units 221, 223, 225, and 227.

According to an embodiment, the organic material detecting operation S2 may be performed by capturing an image of a planar shape of the organic material detection part 220 via photography and/or the like and checking the degree of overflow of the organic material. The organic material detection part 220 may include the detection units 221, 223, 225, and 227, and the detection units 221, 223, 225, and 227 may include the groove pattern 221*h* as shown in FIGS. 3A-3C. In this case, the organic material that overflows when the organic encapsulation layer 420 is formed may be flowed into the groove pattern 221*h*, and, in this case, the groove pattern 221*h* may be checked to easily visually recognize whether the organic material flowed into the groove pattern 221*h*.

According to embodiments as described above, an organic material detection part is disposed outside a dam unit arranged in a peripheral area to facilitate visual recognition of overflow of an organic encapsulation layer included in a thin film encapsulation layer. Accordingly, the amount of an organic material used to form the organic encapsulation layer and surface processing conditions of the organic encapsulation layer may be optimized.

Of course, the scope of the present invention is not limited thereto.

While the inventive concept has been particularly shown and described with reference to exemplary embodiments thereof, it will be understood by those of ordinary skill in the art that various suitable changes in form and details may be made therein without departing from the spirit and scope as defined by the following claims and their equivalents.

What is claimed is:

1. A display apparatus comprising:
    a substrate having a display area in which an image is displayed and a peripheral area outside the display area;
    a film encapsulation layer at the display area, the film encapsulation layer comprising a first inorganic encapsulation layer, an organic encapsulation layer, and a second inorganic encapsulation layer that are stacked;
    a dam at the peripheral area; and
    an organic material detection part outside the dam along a peripheral direction extending from the display area toward the peripheral area, the organic material detection part comprising at least one detector,
    wherein the first inorganic encapsulation layer and the second inorganic encapsulation layer extend from the display area to the peripheral area, and
    wherein the first inorganic encapsulation layer has an opening that corresponds to at least a portion of the organic material detection part, and the second inorganic encapsulation layer is continuously formed across an entire width of the opening such that a step difference is formed wherein a height of the second inorganic encapsulation layer over the opening is lower than a height of the second inorganic encapsulation layer at a region spaced from the opening in the peripheral direction,
    wherein the opening includes a first wall and a second wall facing the first wall.

2. The display apparatus of claim 1, wherein the second inorganic encapsulation layer fills the opening or is at the opening.

3. The display apparatus of claim 1, wherein a height of the second inorganic encapsulation layer disposed on the at least one detector from an upper surface of the substrate is lower than a height of the second inorganic encapsulation layer disposed on the dam from the upper surface of the substrate.

4. The display apparatus of claim 1,
    wherein the organic material detection part comprises a plurality of detectors, and
    wherein the opening corresponds to one of the plurality of detectors.

5. The display apparatus of claim 1, further comprising a thin film transistor (TFT) at the display area, the TFT comprising a semiconductor layer, a gate electrode, a source electrode, and a drain electrode;
    an interlayer insulating layer disposed between the film encapsulation layer and the at least one detector, and
    wherein the at least one detector is on a same layer as the gate electrode and comprises a same material as the gate electrode;
    wherein the interlayer insulating layer extends in the display area.

6. The display apparatus of claim 1, further comprising:
    a first thin film transistor (TFT) at the display area, the first TFT comprising a first semiconductor layer, a first gate electrode, a first source electrode, and a first drain electrode; and
    a second TFT at the display area, the second TFT comprising a second semiconductor layer, a second gate electrode, a second source electrode, and a second drain electrode,
    wherein the first gate electrode and the second gate electrode are on different layers, and
    wherein the at least one detector comprises a first layer on a same layer as the first gate electrode and comprising a same material as the first gate electrode, and a second layer on a same layer as the second gate electrode and comprising a same material as the second gate electrode.

7. The display apparatus of claim 6, wherein an insulating layer is between the first layer and the second layer.

8. The display apparatus of claim 1, further comprising:
    a thin film transistor (TFT) at the display area, the TFT comprising a semiconductor layer, a gate electrode, a source electrode, and a drain electrode; and
    a storage capacitor that overlaps with the TFT,
    wherein the storage capacitor comprises a first electrode, a dielectric layer, and a second electrode that are on a same layer as the gate electrode and are sequentially stacked, and
    wherein the at least one detector is on a same layer as the second electrode and comprises a same material as the second electrode.

9. The display apparatus of claim 1, further comprising a thin film transistor (TFT) at the display area, the TFT comprising a semiconductor layer, a gate electrode, a source electrode, and a drain electrode, and
    wherein the at least one detector is on a same layer as the source electrode or the drain electrode and comprises a same material as the source electrode or the drain electrode.

10. The display apparatus of claim 1, further comprising wiring at the peripheral area,
    wherein the dam covers at least a portion of the wiring.

11. The display apparatus of claim 1,
    wherein the dam comprises a first dam and a second dam spaced from the first dam, and
    wherein at least one of the first dam and the second dam comprises a plurality of layers.

12. The display apparatus of claim 1, wherein, as seen in a plan view of the display apparatus, at least a portion of the at least one detector is along an edge of the display area, and the at least one detector has a groove pattern near the display area.

13. The display apparatus of claim 12,
wherein the at least one detector comprises a straight line shape extending in a first direction, and
wherein a groove pattern is at a certain angle to the first direction.

14. The display apparatus of claim 12, wherein the at least one detector is curved.

15. The display apparatus of claim 1,
wherein the organic material detection part comprises a first detector and a second detector,
wherein the first detector and the second detector are spaced apart from each other and are along an edge of the display area,
wherein the first detector has a groove pattern near the display area, and
wherein the second detector has no groove patterns.

16. The display apparatus of claim 15, wherein the opening corresponds to the first detector.

17. An organic material detecting method performed at a display apparatus having a display area in which an image is displayed and a peripheral area outside the display area and comprising a film encapsulation layer at the display area, and a dam at the peripheral area, the film encapsulation layer comprising a stack of a first inorganic encapsulation layer, an organic encapsulation layer, and a second inorganic encapsulation layer, the organic material detecting method comprising:
forming the organic encapsulation layer; and
detecting an organic material that may overflow while the organic encapsulation layer is being formed, wherein the detecting is performed by an organic material detection part at the peripheral area, the organic material detection part being outside the dam along a peripheral direction extending from the display area toward the peripheral area and comprising at least one detector,
wherein the first inorganic encapsulation layer and the second inorganic encapsulation layer extend from the display area to the peripheral area, and
wherein the first inorganic encapsulation layer has an opening that corresponds to at least a portion of the organic material detection part, and the second inorganic encapsulation layer is continuously formed across an entire width of the opening such that a step difference is formed wherein a height of the second inorganic encapsulation layer over the opening is lower than a height of the second inorganic encapsulation layer at a region spaced from the opening in the peripheral direction,
wherein the opening includes a first wall and a second wall facing the first wall.

18. The organic material detecting method of claim 17,
wherein the organic material detection part comprises at least one detector, and
wherein the detecting of the organic material comprises checking a degree of overflow of the organic material by measuring a step difference of the at least one detector.

19. The organic material detecting method of claim 17,
wherein the organic material detection part comprises at least one detector,
wherein, as seen in a plan view of the display apparatus, at least a portion of the at least one detector is along an edge of the display area, and the at least one detector has a groove pattern near the display area, and
wherein the detecting of the organic material comprises checking an area to which the organic material is overflowed, by visually recognizing a planar shape of the organic material detection part.

20. The organic material detecting method of claim 17,
wherein the display apparatus further comprises a dam in the peripheral area, and
wherein the dam is between the display area and the organic material detection part.

* * * * *